(12) United States Patent
Thoma

(10) Patent No.: US 11,469,662 B2
(45) Date of Patent: Oct. 11, 2022

(54) POWER SUPPLY FOR PROVIDING AN ELECTRICAL PULSE TO AN ELECTRICAL CONSUMER AND A TESTER COMPRISING THE POWER SUPPLY

(71) Applicant: Advantest Corporation, Tokyo (JP)

(72) Inventor: Anton Thoma, Munich (DE)

(73) Assignee: ADVANTEST CORPORATION, Tokyo (JP)

(*) Notice: Subject to any disclaimer, the term of this patent is extended or adjusted under 35 U.S.C. 154(b) by 559 days.

(21) Appl. No.: 16/108,030

(22) Filed: Aug. 21, 2018

(65) Prior Publication Data

US 2018/0358897 A1 Dec. 13, 2018

Related U.S. Application Data

(63) Continuation of application No. PCT/EP2016/053793, filed on Feb. 23, 2016.

(51) Int. Cl.
*H02M 1/00* (2006.01)
*H02M 3/07* (2006.01)
*G01R 1/30* (2006.01)

(52) U.S. Cl.
CPC ............... *H02M 3/07* (2013.01); *G01R 1/30* (2013.01); *H02M 1/00* (2013.01); *H02M 1/0038* (2021.05)

(58) Field of Classification Search
CPC ....................................................... H02M 3/00
See application file for complete search history.

(56) References Cited

U.S. PATENT DOCUMENTS

| | | | |
|---|---|---|---|
| 6,763,049 B1* | 7/2004 | Bees | H03K 3/53 372/58 |
| 9,819,191 B1* | 11/2017 | Steffan | H02J 3/46 |
| 2001/0043050 A1 | 11/2001 | Fisher, Jr. | |
| 2013/0320953 A1 | 12/2013 | Cassel et al. | |
| 2014/0003108 A1* | 1/2014 | Song | H02M 7/483 363/131 |
| 2014/0146571 A1 | 5/2014 | Ryoo et al. | |

* cited by examiner

*Primary Examiner* — Robert Grant

(57) ABSTRACT

A power supply for providing an electric pulse to an electrical consumer is shown. The power supply has an input circuit, a storage capacitor, and an output circuit. The input circuit is configured to charge the storage capacitor up to a maximum voltage. The output circuit is configured to provide one or more pulses having a pulse voltage on the basis of a charge stored in the storage capacitor and to compensate for a reduction of the voltage of the storage capacitor by at least 30% down from the maximum voltage. Moreover, the power supply is configured such that the voltage of the storage capacitor is reduced by at least 30% during the generation of one or more pulses.

19 Claims, 8 Drawing Sheets

| Pinput[W] | Vnom[V] | Vmin[V] | Pload[W] | tpulse[msec] | ηinput[perc] | ηraw[perc] | Chopper[mF] | DutyCycle[perc] |
|---|---|---|---|---|---|---|---|---|
| 100. | 100. | 90. | 1000. | 1. | 90. | 90. | 1.07 | 8.1 |
| 100. | 100. | 80. | 1000. | 1. | 90. | 90. | 0.57 | 8.1 |
| 100. | 100. | 70. | 1000. | 1. | 90. | 90. | 0.4 | 8.1 |
| 100. | 100. | 60. | 1000. | 1. | 90. | 90. | 0.32 | 8.1 |
| 100. | 100. | 50. | 1000. | 1. | 90. | 90. | 0.27 | 8.1 |
| 100. | 100. | 40. | 1000. | 1. | 90. | 90. | 0.24 | 8.1 |
| 100. | 100. | 90. | 1500. | 1. | 90. | 90. | 1.66 | 5.4 |
| 100. | 100. | 80. | 1500. | 1. | 90. | 90. | 0.88 | 5.4 |
| 100. | 100. | 70. | 1500. | 1. | 90. | 90. | 0.62 | 5.4 |
| 100. | 100. | 60. | 1500. | 1. | 90. | 90. | 0.49 | 5.4 |
| 100. | 100. | 50. | 1500. | 1. | 90. | 90. | 0.42 | 5.4 |
| 100. | 100. | 40. | 1500. | 1. | 90. | 90. | 0.38 | 5.4 |

Fig. 4

POWER SUPPLY FOR PROVIDING AN ELECTRICAL PULSE TO AN ELECTRICAL CONSUMER AND A TESTER COMPRISING THE POWER SUPPLY

CROSS-REFERENCE TO RELATED APPLICATION

This application is a continuation of copending International Application No. PCT/EP2016/053793, filed Feb. 23, 2016, which is incorporated herein by reference in its entirety.

BACKGROUND OF THE INVENTION

The present invention relates to a power supply for providing an electric pulse to an electrical consumer and a method for operating the power supply. Embodiments show an electrical apparatus that delivers output power pulses higher than rated maximum input power. Other embodiments show a tester for testing a device under test having the power supply for providing a stimulating signal to the device under test.

Known power supplies using capacitors to form electric pulses suffer from a large area that is covered with capacitors, since a maximum of 10% of the energy stored in the capacitor is used to form the electric pulse. However, integrated circuit boards tend to become smaller and smaller. The size of the storage unit or more precisely the space covered by the one or more capacitors form limitations of all downscaling or downsizing approaches due to the fixed size of the capacitors.

SUMMARY

According to an embodiment, a power supply for providing an electric pulse to an electrical consumer may have: an input circuit; a storage capacitor; and an output circuit; wherein the input circuit is configured to charge the storage capacitor up to a maximum voltage; wherein the output circuit is configured to provide one or more pulses having a pulse voltage on the basis of a charge stored in the storage capacitor; wherein the output circuit is configured to compensate for a reduction of the voltage of the storage capacitor by at least 30% down from the maximum voltage; and wherein the power supply is configured such that the voltage of the storage capacitor is reduced by at least 30% during the generation of one or more pulses.

Another embodiment may have a tester for testing a device under test, the tester having the above inventive power supply, wherein the power supply is configured to use the one or more pulses to provide the device under test with a stimulating signal.

Still another embodiment may have a use of a buck-boost converter, or a flyback converter in a power supply, wherein the buck-boost converter or the flyback converter are configured to form an electric pulse having a pulse voltage being greater than an input voltage and to form a further electric pulse having a further pulse voltage being smaller than an input voltage.

According to another embodiment, a method for operating a power supply for providing an electric pulse to an electrical consumer may have the steps of: charging a storage capacitor up to a maximum voltage; providing one or more pulses having a pulse voltage on the basis of a charge stored in the storage capacitor; compensating for a reduction of the voltage of the storage capacitor by at least 30% down from the maximum voltage; and reducing the voltage of the storage capacitor by at least 30% during the generation of one or more pulses.

According to still another embodiment, a method for operating a tester for testing a device under test may have the steps of: the above inventive method for operating the power supply; and providing the device under test with a stimulating signal from the power supply using the one or more pulses.

Embodiments show a power supply for providing an electric pulse to an electrical consumer. The power supply comprises an input circuit, a storage capacitor, and an output circuit. The input circuit is configured to charge the storage capacitor up to a maximum voltage. The output circuit is configured to provide one or more pulses having a pulse voltage on the basis of a charge stored in the storage capacitor and to compensate for a reduction of the voltage of the storage capacitor by at least 30% down from the maximum voltage. Moreover, the power supply is configured such that the voltage of the storage capacitor is reduced by at least 30% during the generation of one or more pulses.

The present invention is based on the finding that a dimensioning, forming or sizing of the power supply in a way that the capacitor is discharged by at least 30%, reduces the covered space of the storage capacitor to a large extent. To be more specific, a dropping or decreasing of the voltage at the storage capacitor by 30% of the nominal voltage reduces the size of the storage capacitor by more than 60% when compared to a size of the storage capacitor using only a drop of 10% of the nominal voltage. In other words, according to embodiments, more than 60% of the space in a power supply covered by capacitors can be reduced. Moreover, it has to be noted that the capacitors occupy a large space in the power supply when compared to the further components. Therefore, the described reduction of the space covered by the capacitors may reduce a size of the power supply by, for example between 25% and 40%.

Embodiments show that the output circuit is configured to dynamically compensate the reduction of the voltage of the storage capacitor such that a pulse with a constant voltage is obtained even though the capacitor voltage decreases. Therefore, it may be used a DC/DC converter, a buck-boost converter, a wide input buck converter, or a boost converter. The DC/DC converter may comprise an intermediate circuit or a DC link that is configured to provide the constant output voltage of the pulse at the output unit. Optionally, the intermediate circuit may buffer the current or energy derived from the storage capacitor in order to form, e.g. in an output stage, an electric pulse having a width that is smaller than a time needed to discharge the storage capacitor. This is advantageous, since the output circuit may generate the electric pulse having a constant voltage, even though the input voltage of the storage capacitor decreases. Furthermore, the electric pulse does not suffer from an optional increase of the pulse width due to an increased time needed to discharge the capacitor. Moreover, the electric pulse may comprise a pulse voltage being greater than a nominal voltage of the storage capacitor.

Further embodiments show the output circuit configured to provide the electric pulse with more power from the storage unit when compared to a maximum power derivable from the input unit. A factor of the increased power may be, for example between 10 and 100. This is advantageous, since the storage capacitor provides the power supply with a huge amount of energy being derivable, receivable or obtainable faster when compared to a power from the input unit. More generally, the output circuit may be further configured to form a pulse having any output voltage when compared to a base or reference voltage. Therefore, the electric pulse may be greater or smaller than the current voltage of the storage capacitor. Even further, due to the decreasing or shrinking voltage in the storage capacitor, the predetermined or desired pulse voltage may be smaller than the voltage of the storage capacitor in the beginning of the pulse and greater in the end of the pulse.

Therefore, the output circuit is configured to form an electric pulse having a constant pulse voltage being smaller than the voltage of the storage capacitor in the beginning of the electric pulse and greater in the end of the electric pulse. Furthermore, the output circuit may e.g. up-convert the current voltage of the storage capacitor during a first electric pulse and down-convert the current voltage of the storage capacitor during a second electric pulse. Nonetheless, it has to be noted that the output unit cannot exceed the principles (or limits) of energy conversion.

Further embodiments show the power supply with a controller configured to estimate a power used to form the electric pulse, wherein the controller is configured to compare the estimated power with a retrievable power from the storage unit and configured to determine, based on the comparing, a point in time to provide the electric pulse to the electrical consumer such that sufficient power is retrievable at the determined point in time to form the electric pulse. In other words, the controller may monitor the storage capacitor and further estimate a power used to form the electric pulse such that the storage capacitor may provide sufficient power to the output unit. Advantageously, the power is sufficient to form the electric pulse having the predetermined voltage over the whole duration of the electric pulse and such that the electric pulse does not change its pulse voltage due to a loss of power.

According to further embodiments, the power supply further comprises a further output circuit configured to provide one or more further pulses having a further pulse voltage on the basis of a charge stored in the storage capacitor and wherein the further output circuit is configured to compare for a reduction of the voltage of the storage capacitor by at least 30% down from the maximum voltage. In other words, the storage capacitor is configured to provide the energy stored to multiple output units such that a further reduction of the space is obtained when compared to having a storage capacitor for each output unit. Therefore, only one storage capacitor may be used for multiple channels of the power supply.

Moreover, the controller may further determine a power of any electric pulse of the multiple output circuits and to arrange the concurrent access to the storage capacitor such that each of the electric pulses is provided with sufficient energy or power. Further embodiments show the power supply in a tester for testing a device under test. Herein, the power supply may be configured to use the one or more pulses to provide the device under test with a stimulating signal.

Further embodiments show the use of a buck boost converter in a power supply to form an electric pulse of any predetermined pulse voltage. This is advantageous, since the electric pulse is not limited to a nominal voltage of the storage capacitor since the buck boost converter or the flyback converter may provide the electric pulse independently from an input voltage.

BRIEF DESCRIPTION OF THE DRAWINGS

Embodiments of the present invention will be discussed subsequently referring to the enclosed drawings, wherein:

FIG. 4 shows an exemplary table indicating a capacity of the storage capacitor for different allowed discharging limits;

DETAILED DESCRIPTION OF THE INVENTION

In the following, embodiments of the invention will be described in further detail. Elements shown in the respective figures having the same or a similar functionality will have associated therewith the same reference signs.

Figure 1:
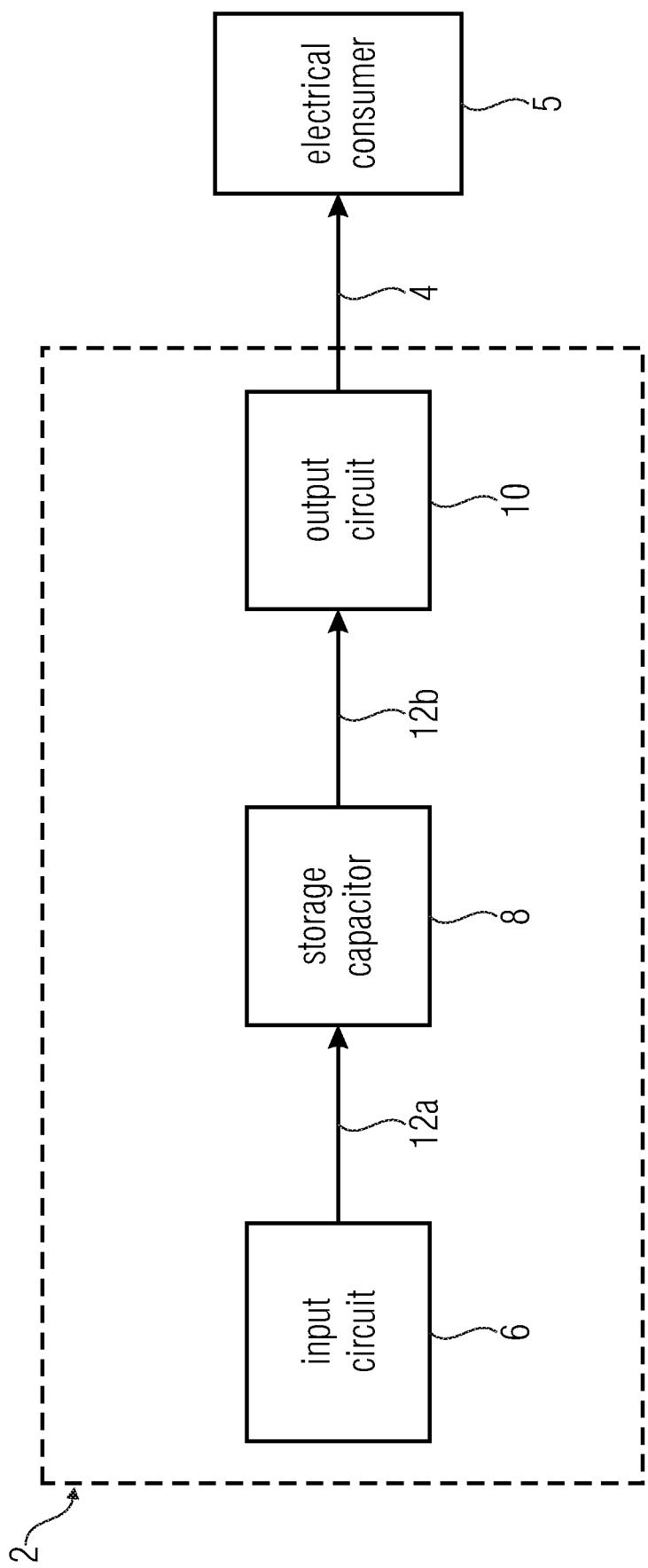
FIG. 1 shows a schematic block diagram of the power supply.

FIG. 1 shows a schematic block diagram of a power supply 2 for providing an electric pulse 4 to an electrical consumer.

The power supply comprises an input circuit 6, a storage capacitor 8, and an output circuit 10. The input circuit 6 is configured to charge the storage capacitor 8 up to a maximum voltage. The maximum voltage may refer to a nominal voltage of the storage capacitor, for example for continuous or permanent operation and may not exceed up to a maximum voltage, for example for a pulsed operation of the storage capacitor 8. To charge the storage capacitor, the input circuit provides charge carriers or a (direct/DC) current 12*a* to the storage capacitor 8. The output circuit is configured to provide one or more pulses for having a pulse voltage on the basis of a charge stored in the storage capacitor 8. Therefore, charge carriers or a (direct/DC) current 12*b* is provided from the storage capacitor 8 to the output circuit 10. Moreover, the output circuit is configured to compensate for a reduction of the voltage of the storage capacitor 8 by at least 30% down from the maximum voltage. Furthermore, the power supply 2 is configured such that the voltage from the storage capacitor is reduced by at least 30% during one or more pulses. A duration of the electric pulse is for example below 10 ms, below 5 ms, or advantageously equal or less than 1 ms. However, a minimum duration of the electric pulse may be greater than 10 ms. The electric pulse may have an average current of more than one ampere, more than 5 ampere, or advantageously more than 10 ampere. However, a maximum current of the electric pulse is below 100 ampere.

Figure 2:
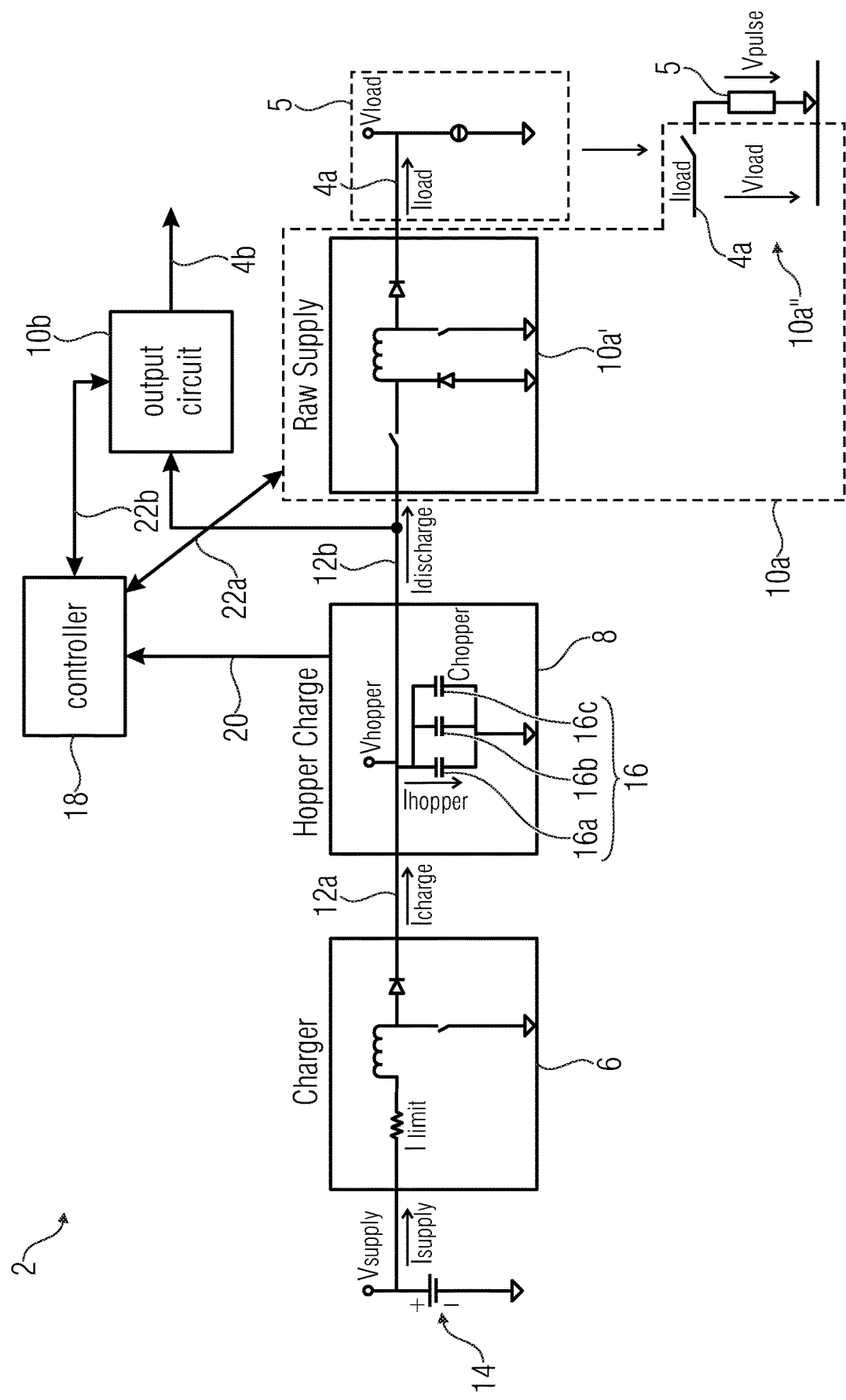
FIG. 2 shows a schematic block diagram of the power supply according to an embodiment.

FIG. 2 shows a schematic block diagram of the power supply 2 according to a further embodiment. The power supply 2 comprises again the input circuit or charger 6, the storage capacitor or hopper charge 8, and the output circuit 10*a*. According to embodiments, the output circuit comprises the raw supply 10*a*' having the specifications of the output circuit 10. According to further embodiments, the output circuit may further comprise an output stage 10*a*"

having e.g. a pulse shaping or pulse timing property. The input circuit 6 may derive the input power from a battery or a (power or electrical) outlet 14 providing either direct current (DC) or alternating current (AC) to the input circuit 6. If the input current of the input circuit is an alternating current, it is advantageous that the charger 6 is configured to rectify or commutate the input current into a direct current 12*a* provided to the storage capacitor 8.

The storage capacitor may comprise one or more capacitances 16, 16*a*, 16*b*, 16*c*, which are charged by the input current 12*a*. One or more output circuits 10*a*, 10*b* may each generate one or more pulses 4*a*, 4*b* using the energy stored in the capacitances 16 of the storage capacitor 8 and provide the pulses 4*a*, 4*b* to (the same or different) electrical consumer.

Therefore, the power supply may comprise a further output circuit 10*b* arranged in parallel to the output circuit 10*a*. The further output circuit 10*b* may provide one or more further pulses 4*b* having a further pulse voltage on the basis of a charge stored in the storage capacitor 8. Moreover, the further output circuit 10*b* may compensate for a reduction of the voltage of the storage capacitor 8 by at least 30% down from the maximum voltage. Therefore, the same storage capacitor may provide multiple output circuits 10 with energy to generate one or more pulses 4 with each of the output circuits 10.

The power supply may further comprise, according to embodiments, a controller 18. The controller 18 may receive a current storage signal 20 indicating a state of charge or a charge level from the storage capacitor 8. Moreover, the controller may have a, for example, bidirectional connection 22*a* to the output circuit 10*a*. Using the direction 22*a*, the controller may receive information regarding a future pulse of the output circuit, which may be an energy or power used to create the pulse or, for example, a duration and a pulse voltage of a future pulse such that the controller is able to calculate an energy or power used to create the future pulse. Based on the state of charge of the storage capacitor and the calculated power (to form the future electric pulse), the controller calculates a point in time where enough or sufficient energy may be derived from the storage capacitor to form the pulse and to provide the output circuit 10*a* with a point in time such that it is ensured that the electric pulse is formed using the predetermined power, pulse voltage and/or pulse duration.

In embodiments having a further output circuit 10*b*, the controller 18 may be configured to estimate a power used to form the electric pulse 4*a* and to estimate a further power used to form the further electric pulse 4*b*. The controller 18 may be further configured to compare the estimated power and the power with a retrievable energy restored in the storage unit 8 and configured to determine, based on the comparing, a point in time to provide the electric pulse 4*a* to the electrical consumer and to determine, based on the comparing, a further point in time to provide the further electric pulse to an electrical consumer such that sufficient power is retrievable at the determined point in time to form the electric pulse 4*a* and such that sufficient power is retrievable at a determined further point in time to form the further electric pulse 4*b*. In other words, the controller 18 may perform a scheduling or a further algorithm to ensure that, even for concurrent accesses to the energy stored in the storage unit, the storage unit does not run out of energy when providing the current 12*b* to the multiple output circuits 10, 10*a*, 10*b*.

In other words, the apparatus or power supply 2 consists of one or more charger units 6, one or more local energy storage unit(s) 8 and one or more output units 10. The charger unit 6 is capable of loading the energy storage 8 by complying with the input power maximum specifications. The charger unit 6 can operate to any status of the energy storage unit or units. The energy storage unit 8 can be filled from input 6 any time and also emptied by the output unit or units 10 at any time (subject to a sufficient charge available). During pulse loading in the output circuit 10 using current 12*b*, the output unit can draw more power from the storage unit 8 delivered by the input unit 6. The amount of energy stored in the storage unit 8 can vary during operation. The output unit is capable of delivering output power 4 at a defined way for any defined storage status of the storage unit 8.

The storage unit exists of or comprises electrical capacitors 16. During operation, the voltage of the capacitors is allowed to vary over time. If the storage unit gets empty, a detection mechanism, for example the controller 18, can inform the apparatus about this state.

The input unit may be a DC/DC converter or an AC/DC converter that delivers charge (carriers) to the storage capacitors 16 until a maximum level of the storage unit (nominal) is reached. The input unit 6 may have a current limit to not exceed the maximum current ratings of the input specifications, for example, backplane current. The input unit 6 may deliver power when power is drawn from the storage as well as for charging the storage capacitors.

The output unit 10 may be a DC/DC converter that delivers power to the output independent of the storage voltage level. This may be for example a wide input buck, a boost, a buck-boost converter, or a flyback converter which may be used as output unit 10. The output unit 10 should able to compensate the change in input voltage from the storage capacitor 8 with sufficient speed such that the electrical pulse is not affected by this change.

Figure 3:
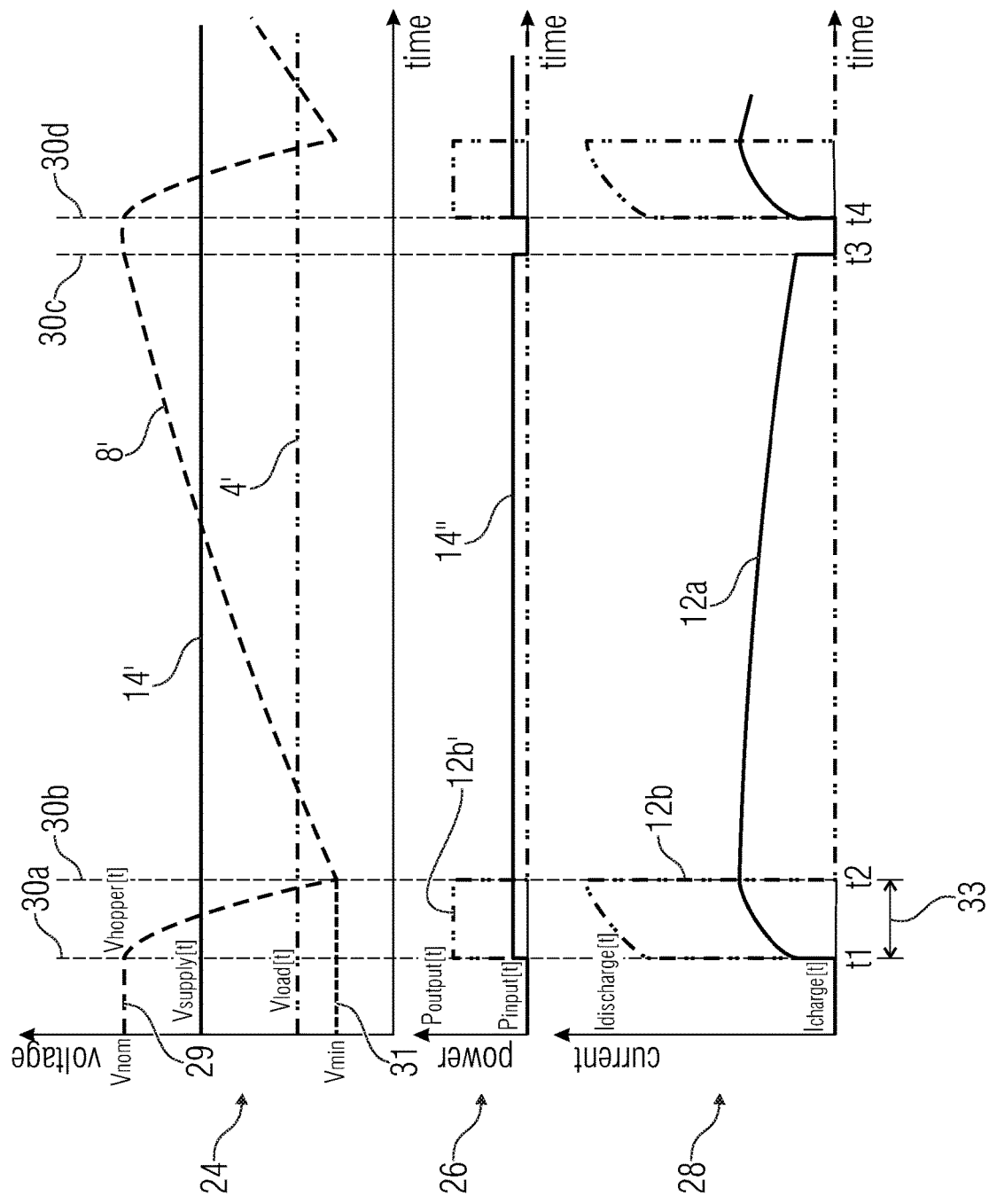
FIG. 3 shows a schematic diagram indicating the relations of input power and voltage of the charged capacitor for both, input and output values.

FIG. 3 shows a schematic diagram indicating input and output values of the power supply. The upper diagram 24 shows the output voltage 4' of e.g. an intermediate circuit or a raw supply of the output circuit 10. Furthermore, diagram 24 presents the input voltage 14' from battery 14, which are (almost) constant during the operation of the power supply 2.

Moreover, the voltage 8' at the output of the storage capacitor 8 is indicated. The middle diagram 26 indicates an input power 14" from battery 14 and the output power 4" incorporated in the electrical pulse. Furthermore, the lower diagram 28 indicates the input current 12*a* and the output current 12*b* of the storage capacitor 8. It has to be noted that, according to embodiments, the output voltage 4' is different from the pulse voltage since an intermediate circuit or a raw supply may provide a constant voltage to an output stage, where a pulse shaping is performed based on the energy stored in the intermediate circuit.

At a point in time t1 30*a* the storage capacitor 8 is completely charged and an electric pulse of a duration from time t1 30*a* to a point in time t2 30*b* is generating having an output power 4". At the end of the pulse generation, the voltage of the storage capacitor may be decreased until a minimum voltage, which is at least 30% lower when compared to the maximum voltage of the storage capacitor. However, according to further embodiments, the storage capacitor is discharged by at least 40%, at least 50% or according to an embodiment by at least 60% of the maximum voltage of the storage capacitor. It has to be noted that the pulse generation may be different from the pulse release to the electrical consumer. The released pulse may be even shorter than the time needed to generate the electric pulse e.g. in the intermediate circuit. Moreover, the released pulse has a pulse voltage being greater than the output voltage 4', measurable e.g. at the electrical consumer 5. Between the point in time t2 30b and the point in time t3 30c, the storage capacitor may be charged, according to an embodiment, up to the maximum voltage of the capacitors in the storage capacitor. Nonetheless, a further electric pulse may be created with a reduced power if the current difference of the voltage of the storage capacitor and the minimum voltage of the capacitor is sufficient to form the electrical pulse. However, if no electric pulse is formed, during the points in time t3 30c and t4 30d, the storage capacitor 8 is completely charged and may be discharged at the point in time t4 30d.

In other words, the diagrams of FIG. 3 sketch example waveforms for operation of the power supply. Therefore, before time t1 the hopper 8 is charged and no input or output current is flowing. At t1 30a, the output starts to sink due to a constant pulse power 12b' at the output of the storage capacitor. This causes a discharge current 12b. Moreover, the voltage at the hopper 8 drops and a charge starts to charge the hopper 8 with a constant power 14". As the discharge current 12b is higher than the charge current 12a, the voltage 8' at the hopper 8 is dropping during pulse load. After $t_{pulse}$ 33, which is the duration of the generation of the electrical pulse, the time step T2 30b is reached and the output does not sink any more, since no power is demanded or requested by the output circuit. As the voltage 8' is still below nominal voltage, the charger 6 fills the hopper 8 with constant power 14" until the hopper 8 is full (t3 30c). At the point in time t4 30d, the pulse at the output circuit is started again and the sequence restarts like at t1 30a. The duty cycle is defined as (t2−t1)/(t4−t1) and may be for example between 2% and 20% or between 5% and 15%. However, other duty cycles may be suitable as well. The waveform of the voltage 8' at the output of the storage capacitor may be between the nominal voltage 29 and the minimum voltage 31.

FIG. 4 shows an exemplary table 32 comparing different minimum voltages 31 at the storage capacitor 8 and the respective minimum or smallest hopper capacitances 8". The input power 14" and the nominal voltage 29 is set to 100 watt and 100 volt, respectively. The pulse duration 33 is set to 1 ms wherein an input efficiency 34 and a raw efficiency 36 are both set to 90%. However, the comparing of the minimum voltage 31 and the hopper capacitance 8" is performed for two different powers 4", namely 1000 watt and 1500 watt, resulting in a duty cycle 38 of 8.1 and 5.4%, respectively. For a 1 kw, 1 ms pulse, a capacitance of 1.07 mF is advantageous when allowing a drop of the voltage of the storage capacitor by a maximum of 10% of the nominal voltage. Allowing dropping by 30% of nominal voltage, the capacitance reduces to 0.2 mF and saves up to 63% of capacitor space.

The exemplary table 32 may be generating using the mathematical model as described below:
Terms:

| ηcharger | efficiency of charger or input circuit |
| ηload | efficiency of the hopper or storage capacitor in connection or in combination with the RAW supply or the output circuit |

Hopper Charger Current:

$$Ihopper[t] \to -\frac{Pload - Pinput\ \eta charger\ \eta load}{\eta load\ Vhopper[t]}$$

Hopper Voltage Differential Equation:

$$-\frac{Pload - Pinput\ \eta charger\ \eta load}{\eta load\ Vhopper[t]} = Chopper\ Vhopper'[t]$$

Time Domain Dependency of Hopper Voltage (Vhopper [t=0]=Vnominal):

$$Vhopper[t] =$$
$$\sqrt{\frac{-2Pload\ t + Chopper\ Vnominal^2\ \eta load + 2\ Pinput\ t\ \eta charger\ \eta load}{Chopper\ \eta load}}$$

Minimum Hopper Charge Entailed to Discharge to Ratio of the Nominal Hopper Voltage:

$$Chopper = \frac{2t\ (-Pload + Pinput\ \eta charger\ \eta load)}{(-1 + \text{Ratio})(1 + \text{Ratio})Vnominal^2 \eta load}$$

For a 1 kW 1 msec pulse a capacitance of 1.07 mF is advantageous or entailed to drop by maximum 10% of nominal voltage. Allowing dropping by 30% of nominal voltage the minimum (entailed) capacitance reduces to 0.40 mF and saves up to 63% of capacitor space.

Figure 5:
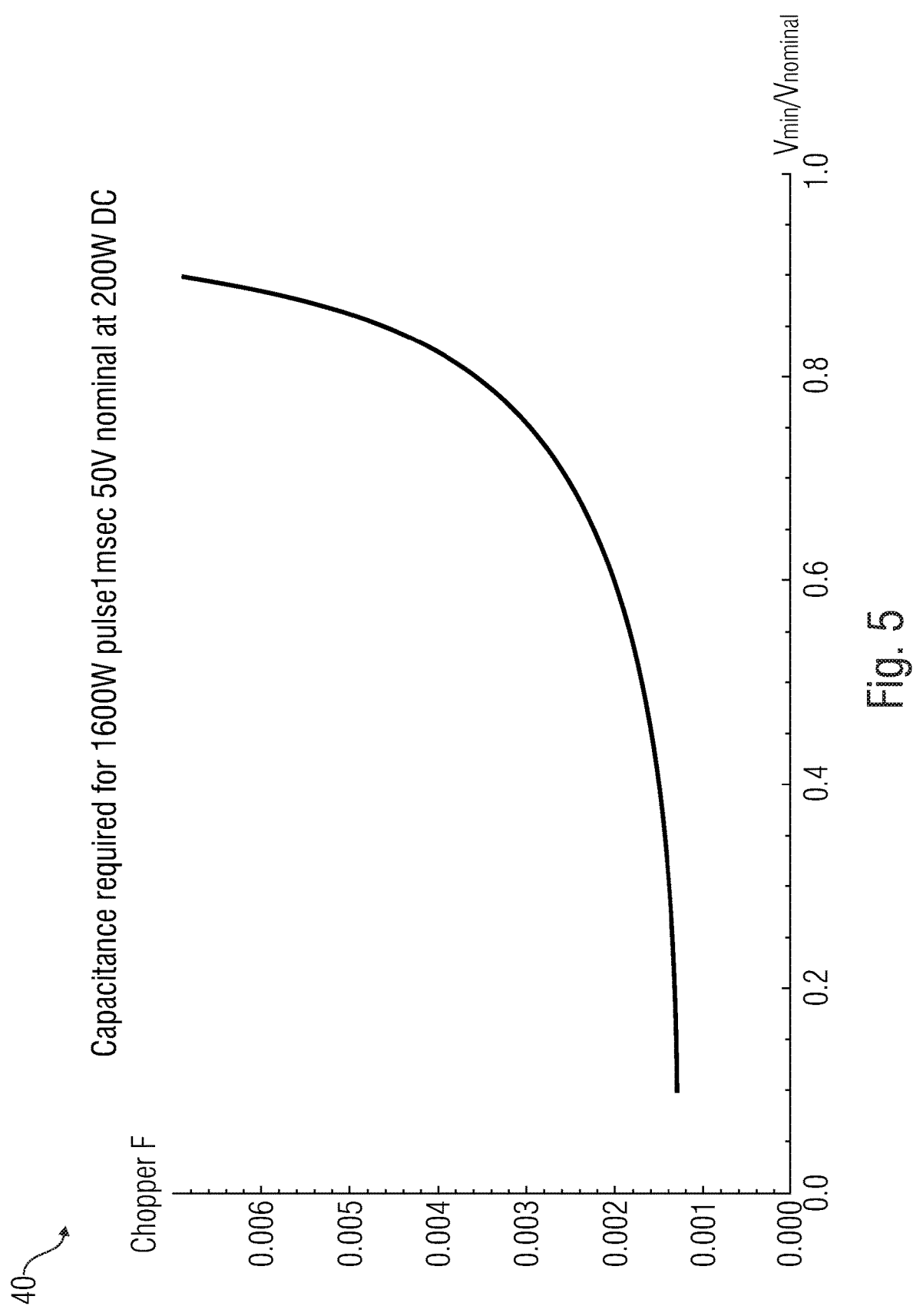
FIG. 5 shows a schematic diagram of the capacitance of the storage capacitor over the minimum voltage of the storage capacitor compared to the nominal voltage of the storage capacitor for forming a 1600 watt pulse for 1 ms.

FIG. 5 shows a chart 40 indicating a minimum hopper capacitance for generating a 1600 W pulse, where the nominal hopper voltage is 50 volt at a 200 DC power supply. Efficiencies are assumed to be 90%. Allowing to discharge down to 50% reduces the capacitance from 7 mF (Milli-Farad) (90% case) to approximately 1.6 mF.

Figure 6:
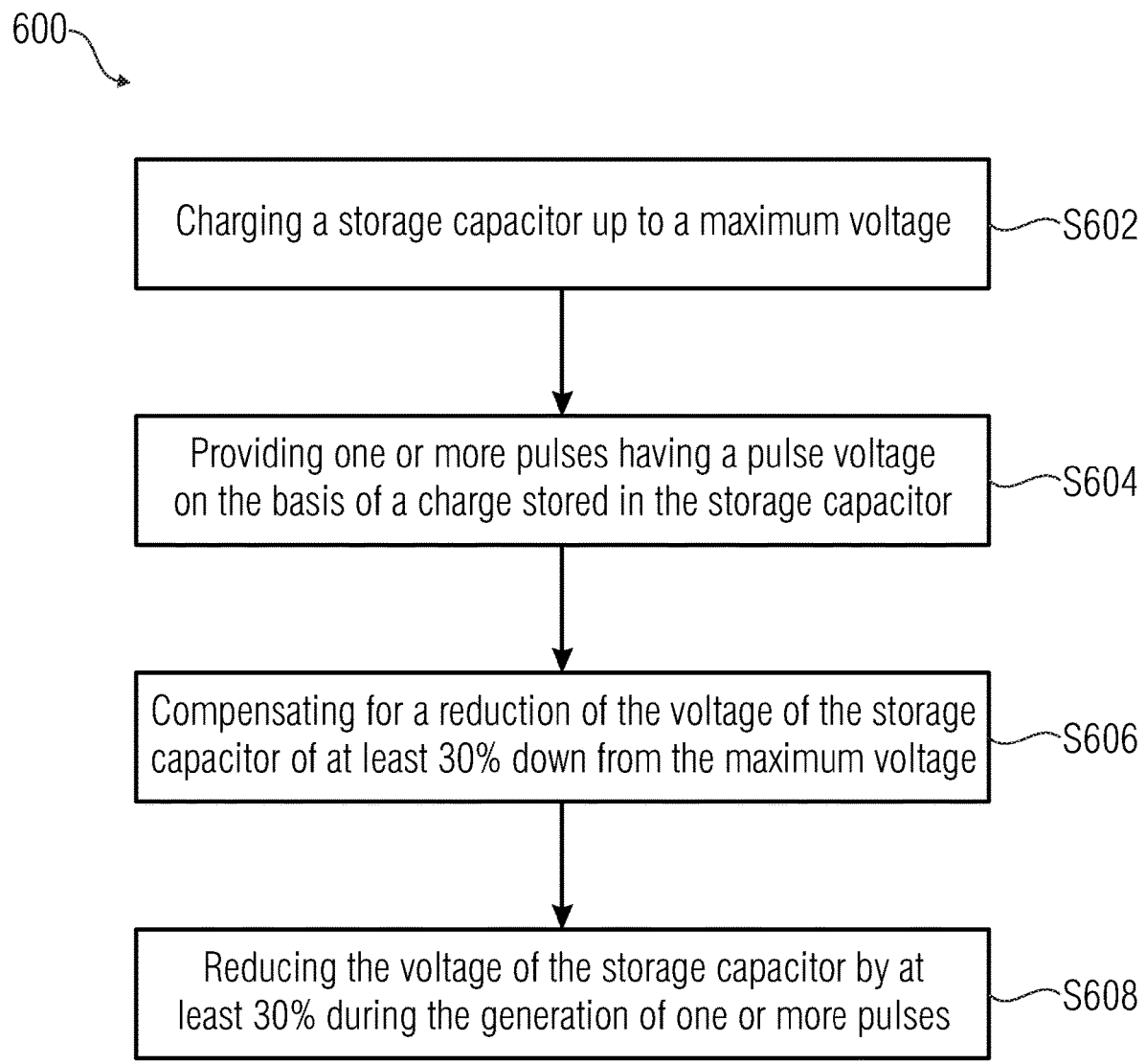
FIG. 6 shows a flowchart of an exemplary method for operating a power supply for providing an electric pulse to an electrical consumer.

FIG. 6 shows a flowchart of a method 600 for operating a power supply for providing an electric pulse to an electrical consumer. The method 600 comprises a step S602 of charging a storage capacitor up to a maximum voltage, a step S604 of providing one or more pulses having a pulse voltage on the basis of a charge stored in the storage capacitor, a step S606 of compensating for a reduction of the voltage of the storage capacitor of at least 30% down from the maximum voltage, and a step S608 of reducing the voltage of the storage capacitor by at least 30% during the generation of one or more pulses.

Figure 7:
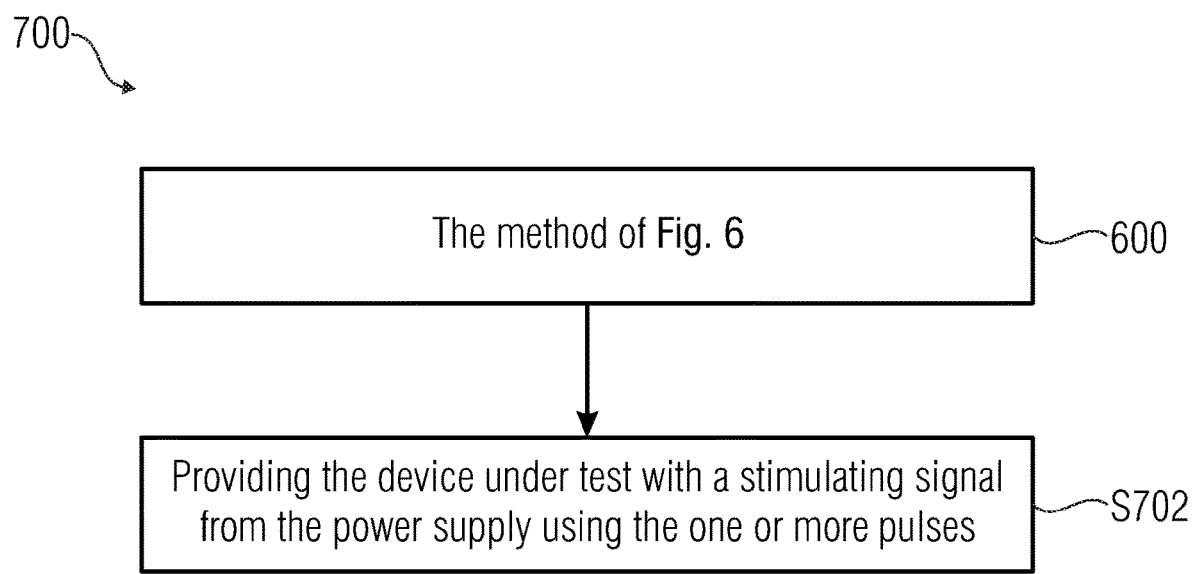
FIG. 7 shows a flowchart of an exemplary method for operating a tester for testing a device under test.

FIG. 7 shows a flowchart of a method 700 for operating a tester for testing a device under test. The method 700 comprises the steps of method 600 and a step S702 of providing the device under test with a stimulating signal from the power supply using the one or more pulses.

Figure 8:
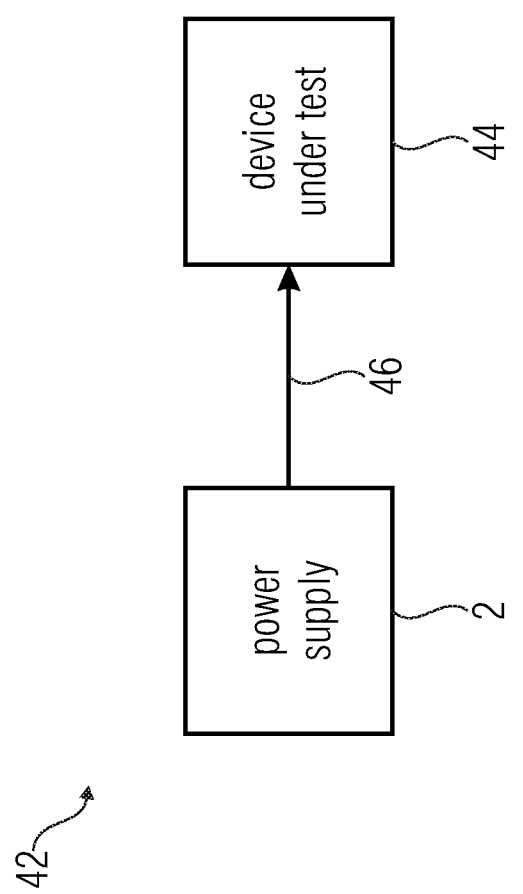
FIG. 8 shows a block diagram of an exemplary method for operating a tester for testing a device under test.

FIG. 8 shows a schematic block diagram of a tester 42 for testing a device under test 44. The tester 42 comprises the power supply 2 for providing the device under test 44 with a stimulating signal 46. The stimulating signal 46 is or comprises advantageously the electric pulse 4 of the power supply 2. In a tester, the power supply may be used to provide the device under test with the electric pulse to measure impulse responses of (a part of or components of) the device under test.

Embodiments show power instruments using pulsed current outputs. Power conversion on instrument boards are limited by backplane input current and cannot deliver higher output currents. Local storage capacitors help extending pulse length, but only for small voltage changes of capacitors. These decoupling capacitors use up a large space of board.

Allowing a discharge of the capacitors by at least 30% saves board space and enables power instruments with higher channel count.

In other words, it is shown an electrical apparatus that delivers output power pulses higher than rated maximum input power.

Embodiments further show the apparatus consisting or comprising of one or more input units, one or more local energy storage units and one or more output units. An input unit is capable of loading the energy storage by complying with the input power maximum specifications. An input unit can operate to any status of the energy storage to storage unit or units.

According to embodiments, the energy storage unit can be filled from input unit any time and also emptied by output unit or units at any time. During pulse loading the output unit can draw more power from storage unit to be diverted by the input unit. The amount of energy stored in the storage unit can vary during operation. The output unit is capable of delivering output power at a defined way for any defined storage stages of the storage unit.

According to embodiments, the storage unit exists of or comprises electrical capacitors. During operation the voltage of the capacitors is allowed to vary over time. If the storage unit becomes empty a detection mechanism can inform the apparatus about this stage.

According to embodiments, the input unit is a DC/DC converter that delivers charge to the charge capacitors and to a maximum level of storage unit (full) is reached. The input unit has a current limit to not exceed the maximum current ratings of the input specification (e.g. backplane current). The input unit will deliver power when power is drawn from the storage as well as for charging the storage capacitors.

According to embodiments, the output unit is a DC/DC converter that delivers power to the output independent of the storage voltage level, e.g. wide input buck, boost or buck-boost converters might be used as output unit.

According to embodiments, the output circuit is configured to provide a specific output voltage to the electrical consumer independent or regardless of a change of the input voltage of the storage capacitor. Therefore, the circuit may be dynamic. Moreover, due to the constant output voltage, input specifications of the electrical consumer are fulfilled during the operation of the power supply. Therefore, it is possible to allow and perform a discharge or drop of the voltage of the storage capacitor by more than 30% since the output circuit is capable to deal with a large variance of the input voltage. Moreover, the output circuit may operate with an input current, which is the current from the storage capacitor, being smaller, greater or equal to the output current. Moreover, the up and down conversion may be dynamically adapted due to the specification of the current electric pulse. Moreover, the output power of the electric pulse may be set by a user, wherein the output circuit is configured to adapt the output voltage and output current of the electric pulse.

According to embodiments, a capacitance of the storage capacitor may be formed using for example a 60 volt aluminum electrolytic capacitor or an electrolytic capacitor (e-cap).

Moreover, the controller may control the output circuit such that a maximum average pulse power is not exceeded by the short-temporal pulses, which may be significantly higher than the average pulse power the output circuit may withstand.

It is to be understood that in this specification, the signals on lines are sometimes named by the reference numerals for the lines or are sometimes indicated by the reference numerals themselves, which have been attributed to the lines. Therefore, the notation is such that a line having a certain signal is indicating the signal itself. A line can be a physical line in a hardwired implementation. In a computerized implementation, however, a physical line does not exist, but the signal represented by the line is transmitted from one calculation module to the other calculation module.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A power supply for providing an electric pulse to an electrical consumer, the power supply comprising:
   an input circuit;
   a storage capacitor; and
   an output circuit;
   wherein the input circuit is configured to charge the storage capacitor to a maximum voltage;
   wherein the output circuit is configured to provide one or more pulses comprising a pulse voltage on a basis of a charge stored in the storage capacitor;
   wherein the output circuit is configured to compensate for a reduction of a voltage of the storage capacitor by at least 30% from the maximum voltage; and
   wherein the power supply is configured to reduce the voltage of the storage capacitor by at least 30% due to the generation of the one or more pulses.

2. The power supply according to claim 1, wherein the output circuit is configured to dynamically compensate the reduction of the voltage such that the pulse voltage with a constant voltage is provided even though the voltage of the storage capacitor decreases.

3. The power supply according to claim 1, wherein the output circuit comprises one of a DC/DC converter, a buck-boost converter, a wide input buck converter, a boost converter, or a flyback converter.

4. The power supply according to claim 1, wherein the output circuit is configured to provide the one or more pulses with more power from the storage capacitor when compared to a maximum power derivable from the input circuit.

5. The power supply according to claim 1, wherein the output circuit is configured to provide the one or more pulses with a power from the storage capacitor.

6. The power supply according to claim 1, wherein the output circuit is configured to provide the one or more pulses with a power from the storage capacitor, wherein the power from the storage capacitor is between 3 and 100 times greater than a maximum power derivable from the input circuit.

7. The power supply according to claim 1, further comprising:
a controller configured to estimate a power used to provide the one or more pulses, wherein the controller is further configured to compare the estimated power with a retrievable power from the storage capacitor to generate a comparison result and configured to determine, based on the comparison result, a point in time to provide the one or more pulses to the electrical consumer such that sufficient power is retrievable at the determined point in time to provide the one or more pulses.

8. The power supply according to claim 1, further comprising:
a second output circuit configured to provide one or more second pulses comprising a further second pulse voltage on the basis of the charge stored in the storage capacitor;
wherein the second output circuit is configured to compensate for the reduction of the voltage of the storage capacitor by at least 30% from the maximum voltage.

9. The power supply according to claim 8, further comprising:
a controller configured to estimate a power used to form the one or more pulses and to estimate a second power used to form the one or more pulses, wherein the controller is configured to compare the estimated power and the estimated second power with a retrievable energy stored in the storage capacitor to generate a comparison result and configured to determine, based on the comparison result, a point in time to provide the one or more pulses to the electrical consumer and to determine, based on the comparison result, a second point in time to provide the one or more pulses to the electrical consumer such that sufficient power is retrievable at the determined point in time to form the one or more pulses and such that sufficient power is retrievable at the determined second point in time to form the one or more pulses.

10. The power supply according to claim 1, wherein a duration of the one or more pulses is below 10 ms.

11. A tester for testing a device under test, the tester comprising:
a power supply comprising an input circuit, a storage capacitor, and an output circuit, wherein the input circuit is configured to charge the storage capacitor to a maximum voltage, wherein the output circuit is configured to provide one or more pulses comprising a pulse voltage on a basis of a charge stored in the storage capacitor wherein the output circuit is configured to compensate for a reduction of a voltage of the storage capacitor by at least 30% from the maximum voltage, wherein the power supply is configured to reduce the voltage of the storage capacitor by at least 30% due to generation of one or more pulses, and wherein the power supply is configured to use the one or more pulses to provide the device under test with a stimulating signal.

12. A method comprising:
providing a buck-boost converter or a flyback converter in a power supply;
using the buck-boost converter or the flyback converter to form an electric pulse comprising a pulse voltage on the basis of a charge stored in the storage capacitor, wherein the pulse voltage is greater than an input voltage to the power supply;
compensating for a reduction of a voltage of the storage capacitor, wherein the compensating includes dynamically compensating the reduction of the voltage of the storage capacitor such that a constant pulse voltage is provided even though the voltage of the storage capacitor decreases; and
using the buck-boost converter or the flyback converter to form a second electric pulse comprising a second pulse voltage that is smaller than the input voltage.

13. A method for operating a power supply for providing an electric pulse to an electrical consumer, the method comprising:
charging a storage capacitor up to a maximum voltage;
providing one or more pulses comprising a pulse voltage on a basis of a charge stored in the storage capacitor;
compensating for a reduction of a voltage of the storage capacitor by at least 30% from the maximum voltage; and
reducing the voltage of the storage capacitor by at least 30% due to generation of the one or more pulses.

14. The method according to claim 13, further comprising:
providing a device under test with a stimulating signal from the power supply using the one or more pulses, wherein the device under test is coupled to a tester for testing the device under test.

15. The method according to claim 12, wherein one or more pulses are provided with more power from the storage capacitor when compared to a maximum power derivable from the input circuit.

16. The method according to claim 12, wherein one or more pulses are provided with power from the storage capacitor.

17. The method according to claim 12, wherein one or more pulses are provided with power from the storage capacitor, wherein the power from the storage capacitor is between 3 and 100 times greater than a maximum power derivable from the input circuit.

18. The method according to claim 12, further comprising:
estimating a power used to provide the one or more pulses;
comparing the estimated power with a retrievable power from the storage capacitor to generate a comparison result; and
determining, based on the comparison result, a point in time to provide the one or more pulses to the electrical consumer such that sufficient power is retrievable at the determined point in time to provide the one or more pulses.

19. The method according to claim 12, further comprising:
providing one or more second pulses comprising a further second pulse voltage on the basis of the charge stored in the storage capacitor.

* * * * *